(12) United States Patent
Baumgartner et al.

(10) Patent No.: US 7,906,831 B2
(45) Date of Patent: Mar. 15, 2011

(54) SEMICONDUCTOR DEVICE WITH CAPACITOR ARRANGEMENT ELECTRICALLY COUPLED TO INDUCTOR COIL

(75) Inventors: Peter Baumgartner, Munich (DE); Philipp Riess, Munich (DE)

(73) Assignee: Infineon Technologies AG, Neubiberg (DE)

( * ) Notice: Subject to any disclaimer, the term of this patent is extended or adjusted under 35 U.S.C. 154(b) by 142 days.

(21) Appl. No.: 12/235,614

(22) Filed: Sep. 23, 2008

(65) Prior Publication Data
US 2010/0072572 A1    Mar. 25, 2010

(51) Int. Cl.
*H01L 29/94* (2006.01)

(52) U.S. Cl. .................. 257/531; 257/532; 257/E29.343
(58) Field of Classification Search .................. 257/531
See application file for complete search history.

(56) References Cited

U.S. PATENT DOCUMENTS 6,072,205 A * 6/2000 Yamaguchi et al. .......... 257/277
7,038,294 B2 * 5/2006 Ma et al. ....................... 257/528

\* cited by examiner

*Primary Examiner* — Stephen W Smoot
(74) *Attorney, Agent, or Firm* — Infineon Technologies; Philip H. Schlazer

(57) ABSTRACT

One or more embodiments relate to a semiconductor device, comprising: a inductor coil including a winding; and a capacitor arrangement including at least one capacitor, the capacitor arrangement electrically coupled to the inductor coil, the footprint of the capacitor arrangement at least partially overlapping the footprint of the inductor coil.

19 Claims, 10 Drawing Sheets

US 7,906,831 B2

SEMICONDUCTOR DEVICE WITH CAPACITOR ARRANGEMENT ELECTRICALLY COUPLED TO INDUCTOR COIL

FIELD OF THE INVENTION

Generally, the present invention relates to semiconductor devices, and, in particular, to semiconductor devices comprising inductors and capacitors.

BACKGROUND OF THE INVENTION

Inductors and capacitors may be components of a semiconductor device. Examples of capacitors include metal-insulator-metal (MIM) capacitors and vertical-parallel-plate (VPP) capacitors.

SUMMARY OF THE INVENTION

One or more embodiments relate to a semiconductor device, comprising: a inductor coil including a winding; and a capacitor arrangement including at least one capacitor, the capacitor arrangement electrically coupled to the inductor coil, the footprint of the capacitor arrangement at least partially overlapping the footprint of the inductor coil.

One or more embodiments relate to a semiconductor device, comprising: an inductor coil including a winding; and a capacitor arrangement including at least one capacitor, the capacitor arrangement electrically coupled to the inductor coil, the capacitor arrangement at least partially overlying or at least partially underlying the inductor coil.

One or more embodiments relate to a semiconductor device, comprising: an inductor coil including a winding; and a capacitor arrangement electrically coupled to the inductor coil, wherein the maximum magnetic field at the capacitor arrangement is at least 70% of the maximum magnetic field at the outer perimeter of the winding.

One or more embodiments relate to a semiconductor device, comprising: a substrate; an inductor coil disposed over the substrate; and a capacitor arrangement including at least one capacitor, the capacitor arrangement electrically coupled to the inductor coil, the capacitor arrangement disposed over the substrate, wherein at least a portion of the parasitic capacitance between the inductor coil and the substrate is shared with at least a portion of the parasitic capacitance between the capacitor arrangement and the substrate.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
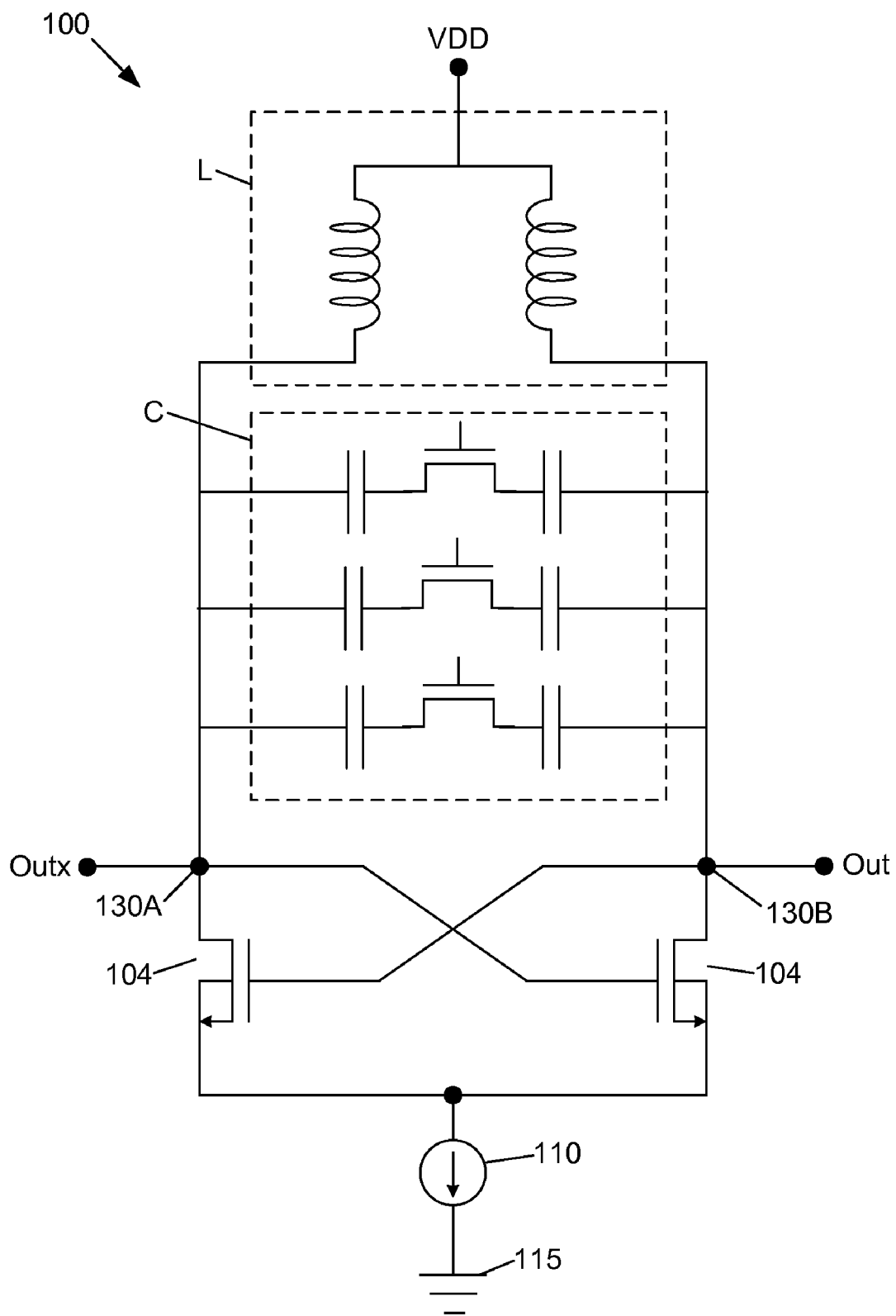
FIG. 1 shows an example of a circuit that includes an inductive component and a capacitive component.

FIG. 1 shows an example of a circuit 100 that includes an inductive component L and a capacitive component C. The circuit includes transistors 104. The circuit 100 further includes a current source/sink 110 electrically coupled to a ground 115. The circuit 100 further includes node 130A (labeled "Outx") as well as node 130B (labeled "Out"). "VDD" represents a supply voltage. The circuit may be an RF circuit. The circuit may be formed as an integrated circuit as part of a semiconductor device or semiconductor chip. In one or more embodiments, the components may be formed within and/or over a substrate. The substrate may be any substrate known in the art. The substrate may be a semiconductor substrate. The semiconductor substrate may be a silicon substrate or other suitable substrate. The substrate may be a silicon-on-insulator (SOI) substrate. The SOI substrate may, for example, be formed by a SIMOX process. In one or more embodiments a bonded SOI or "Smartcut" process may be used. The substrate may be a silicon-on-sapphire (SOS) substrate. The substrate may be a p-type silicon substrate.

The performance of the circuit 100 may depend on parasitic capacitances and resistances of passive components. For example, the current consumption and phase noise of the circuit 100 shown in FIG. 1 may be determined by the quality factor for the LC resonant circuit. This quality factor may depend on the series resistance of inductors and capacitors. The tuning range of the voltage controlled oscillator may depend on the parasitic capacitances of the components.

The series resistances may be reduced by increasing the metal thicknesses of the top metal layers which are used for inductors. Parasitic capacitances may be reduced, for example, by using metal-insulator-metal (MIM) capacitors.

By combining the individual capacitors and inductors it may be possible to reduce the series resistance and/or the parasitic capacitance by sharing the parasitics of the separate devices.

Figure 2A:
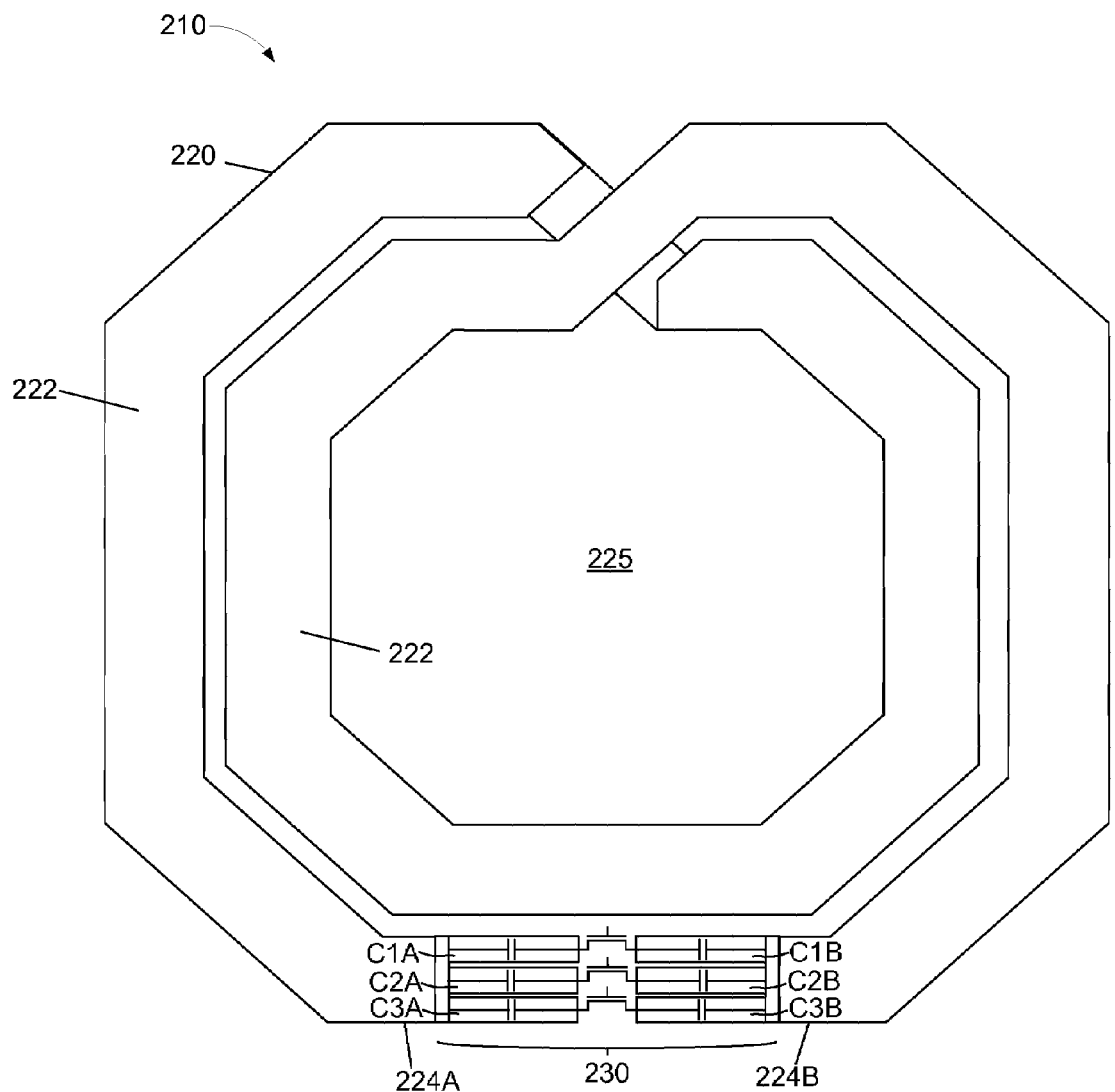
FIG. 2A shows an inductor coil and a capacitor arrangement in accordance with an embodiment of the present invention.

FIG. 2A shows a semiconductor device 210. The semiconductor device 210 may be referred to as an LC semiconductor device. The LC semiconductor device 210 comprises an inductor coil 220 and a capacitor arrangement 230 which is electrically coupled to the inductor coil 220. In one or more embodiments, the LC semiconductor device 210 may be a part of a more complex semiconductor device, a semiconductor chip and/or an integrated circuit. In one or more embodiments, the LC semiconductor device 210 may further include a semiconductor substrate such as a silicon substrate. The inductor coil 220 and/or the capacitor arrangement 230 may each be formed within and/or over the substrate. In one or more embodiments, the inductor coil 220 and/or the capacitor arrangement 230 may be formed over the substrate. As noted above, the substrate may be any substrate known in the art. The substrate may be a semiconductor substrate. The semiconductor substrate may be a silicon substrate or other suitable substrate. The substrate may be a silicon-on-insulator (SOI) substrate. The SOI substrate may, for example, be formed by a SIMOX process. In one or more embodiments a bonded SOI or "Smartcut" process may be used. The substrate may be a silicon-on-sapphire (SOS) substrate. The substrate may be a p-type silicon substrate.

In the embodiment shown in FIG. 2A, the inductor coil 220 includes a winding 222. In the embodiment, the winding 222 is in the form of a spiral. However, in another embodiment, the winding 222 may be in the form of a loop. In the embodiment shown in FIG. 2A, the winding 222 may comprise a conductive strip. Generally, the winding 222 of the inductor coil 220 may comprise any conductive material. In one or more embodiments, the winding 222 may comprise a metallic material. For example, the winding 222 may comprise a pure metal or a metal alloy. In one or more embodiments, the winding 222 may comprise one or more elements selected from the group consisting of Al (aluminum), Cu (the element copper), Au (gold), Ag (silver), W (tungsten), Ti (titanium), and Ta (tantalum). Examples of materials include, but not limited to, pure aluminum, aluminum alloy, pure copper, copper alloy, pure gold, gold alloy, pure silver, silver alloy, pure tungsten, tungsten alloy, pure titanium and titanium alloy.

In one or more embodiments, the winding 222 may be formed from at least a portion of one or more metallization layers of various metallization levels (for example, Metal 1, Metal 2, Metal 3, etc.) of a semiconductor device. In one or more embodiments, the winding 222 may comprise at lease a portion of a metallization layer of a metallization level (for example, Metal 1, Metal 2, Metal 3, etc.) of a semiconductor device. In one or more embodiments, the winding 222 may comprise a conductive line from a metallization layer of a metallization level (for example, Metal 1, Metal 2, Metal 3, etc.) of a semiconductor device.

In one or more embodiments, it is possible that the winding 222 comprise non-metallic materials. For example, the winding 222 may comprise a silicon material such as a doped polysilicon material. The doped polysilicon material may be n-doped and/or p-doped.

In one or more embodiments, it is also possible that the winding 222 of the inductor coil comprises one or more conductive vias from the metallization system of a semiconductor device.

In the embodiment shown in FIG. 2A, the inductor coil 220 includes an interior region 225.

In the embodiment shown in FIG. 2A, the LC semiconductor device 210 further comprises a capacitor arrangement 230. The capacitor arrangement 230 is electrically coupled between a first end portion 224A of the winding 222 and a second end portion 224B of the winding 222. In one or more embodiments, the capacitor arrangement 230 may be coupled to the end portion 224A and to the end portion 224B such that the capacitor arrangement 230 at least partially underlies each of the end portions 224A and 224B.

The capacitor arrangement 230 includes a capacitive component represented as $C_{230}$. In an embodiment, the capacitor arrangement 230 may also include an inductive component represented as $L_{230}$. The inductive component $L_{230}$ of the capacitor arrangement 230 may also contribute to the total inductance of the LC semiconductor device 210. Hence, in an embodiment, the total inductance of the LC semiconductor device 210 may include at least the inductance due to the inductor coil 220 plus the inductance due to the capacitor arrangement 230.

In the embodiment shown, the capacitor arrangement 230 includes capacitors C1A, C1B, C2A, C2B and C3A, C3B. The capacitance of the capacitor arrangement 230 may be changed by switching the transistors shown either on or off (the transistors are labeled as T1, T2 and T3 in FIG. 4). Switching transistor T1 on (transistor T1 is labeled in FIG. 4) electrically couples capacitor C1A to capacitor C2A. Switching transistor T2 on (transistor T2 is labeled in FIG. 4) electrically couples capacitor C1A to capacitor C2A. Switching transistor T3 on (transistor T3 is labeled in FIG. 4) electrically couples capacitor C1A to capacitor C2A. In the embodiment shown in FIG. 2A, there are three pairs of capacitors. More generally, there may be one or more pairs of capacitors.

Hence, the capacitance of the capacitor arrangement 230 shown in FIG. 2A may be changed or modified so that the capacitor arrangement 230 has a capacitance which is variable or tunable. Other capacitor arrangements are, of course, possible. In one or more embodiments, it is possible that at least one of the capacitor pairs (for example, capacitor pair C1A/C1B) be replaced with a fixed capacitor coupled between the first end portion 224A of the winding 222 and the second end portion 224B of the winding 222 so that there is some minimum capacitance coupled between the first end portion 224A and the second end portion 224B of the winding 222.

In one or more embodiments, it is possible that the capacitor arrangement 230 be replaced with another capacitor arrangement that also has a variable capacitance. In one or more embodiments, it is possible that the capacitor arrangement has a totally fixed capacitance. In one or more embodiments, it is possible that the capacitor arrangement has a totally variable capacitance. In one or more embodiments, it is possible that the capacitor arrangement has a partially fixed and a partially variable capacitance. Generally, the capacitor arrangement may include one or more capacitors.

Referring to the embodiment shown in FIG. 2A, each of the capacitors C1A, C1B, C2A, C2B, C3A, C3B may be implemented in many different ways. For example, in one or more embodiments, the capacitors may be implemented using a vertical parallel plate (VPP) capacitor design. In one or more embodiments, the capacitors may be implemented using a metal-insulator-metal (MIM) capacitor design. In another embodiment, the capacitors may be implemented using a stacked capacitor design. It is also possible that different capacitor designs be used in the same capacitor arrangement.

Figure 3A:
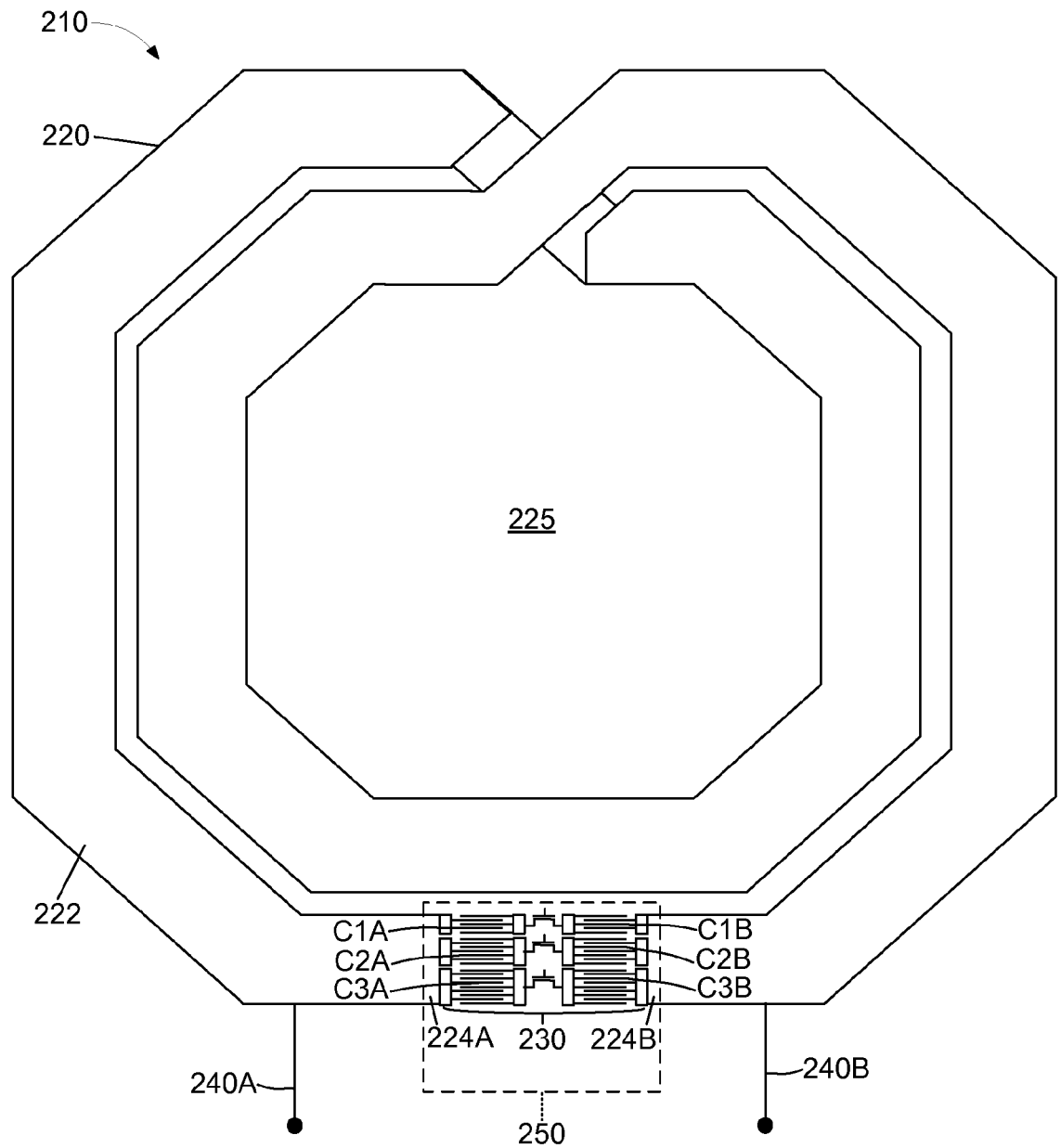
FIG. 3A shows an inductor coil and a capacitor arrangement in accordance with an embodiment of the present invention.

An embodiment of a capacitor arrangement using a plurality of vertical parallel plate (VPP) capacitors is shown in FIG. 3A. As shown in FIG. 3A, each of the capacitors is implemented using a vertical parallel plate (VPP) capacitor structure. Generally, one or more vertical parallel plate capacitors may be used. FIG. 3A also shows a first terminal 240A and a second terminal 240B which have been electrically coupled to the winding 222 of the inductor coil 220 on opposite sides of the capacitor arrangement 230. It is possible that additional terminals be coupled to the winding 222 of the inductor coil 220.

Figure 4A:
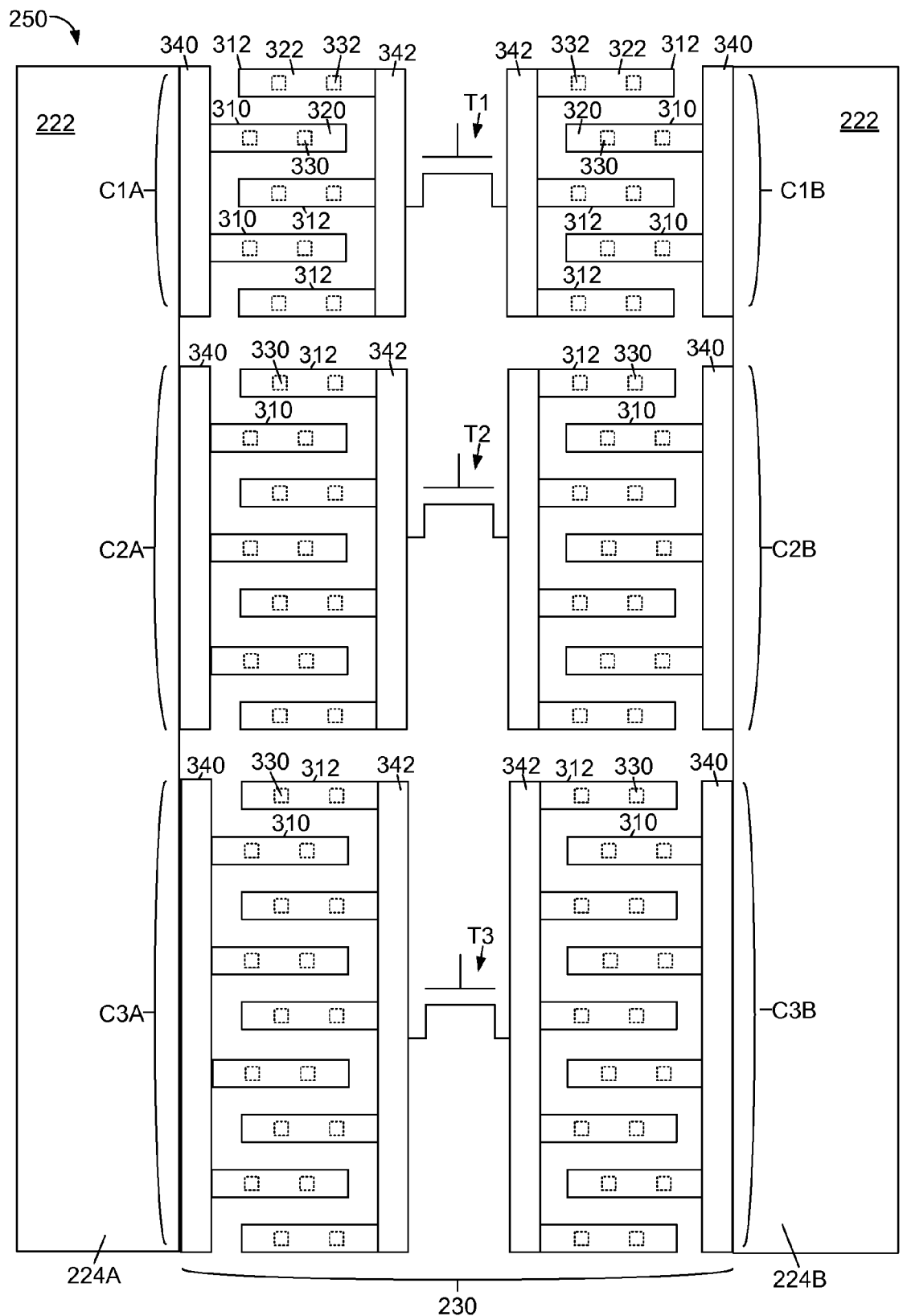
FIG. 4A shows a detailed view of a capacitor arrangement in accordance with an embodiment of the present invention.

FIG. 4A shows an enlarged view of portion 250 of the capacitor arrangement 230 coupled to the end portions 224A,B of the winding 222. In the embodiment shown in FIG.

4A, each of the capacitors C1A, C1B, C2A, C2B, C3A, C3B are structured as vertical parallel plate (VPP) capacitors. Generally, each of the capacitors may include one or more substantially vertical first conductive plates 310. In one or more embodiments, each of the capacitors may include a plurality of first conductive plates 310. In addition, each of the capacitors may include one or more substantially vertical second conductive plates 312. In one or more embodiments, each capacitor may include a plurality of second conductive plates 312.

In one or more embodiments, the first conductive plates 310 are spacedly disposed from the second conductive plates 312. In one or more embodiments, the first conductive plates 310 may be separated from the second conductive plates 312 by a dielectric. The dielectric may, for example, comprise an oxide, a nitride, an oxynitride or a combination thereof. In one or more embodiments, the dielectric may include a high-k dielectric material. The high-k material may have a dielectric constant greater than that of silicon dioxide. In one or more embodiments, the dielectric may comprise a gas. In one or more embodiments, the dielectric may comprise air. In one or more embodiments, the dielectric may comprise a vacuum. In one or more embodiments, the first conductive plates 310 may be separated from the second conductive plates 312 by a semiconductor.

In the embodiment shown in FIG. 4A, for each capacitor, the first conductive plates 310 may be electrically coupled together through a connector bar 340 to form a first capacitor electrode for the individual capacitor. Likewise, for each capacitor, the second conductive plates 312 may be electrically coupled together through a connector bar to form a second capacitor electrode for the respective capacitor. The electrical coupling may be accomplished in many different ways and the connector bars may be replaced by other coupling structures and methodologies. Hence, in one or more embodiments, each of the capacitors may include a first capacitor electrode spacedly disposed from a second capacitor electrode by a dielectric. The first capacitor electrode may be separated from the second capacitor electrode by a dielectric.

FIG. 4A shows the transistor T1 which selectively couples the capacitor C1A to capacitor C1B. The transistor T2 selectively couples the capacitor C2A to the capacitor C2B. The transistor T3 selectively couples the capacitor C3A to the capacitor C3B. One or more of the transistor T1, T2, T3 may be replaced by another form of controllable switch or controllable interconnect.

Referring to FIG. 4A, in one or more embodiments, in one or more embodiments, first end portion 224A and/or second end portion 224B may at least partially overlie the capacitor arrangement 230. In one or more embodiments, it may be possible that at least a portion of the capacitor assembly 230 be at the same level as the winding 222 of the inductor coil 220. In one or more embodiments, it may also be possible that the first end portion 224A and/or the second end portion 224B may at least partially underlie the capacitor arrangement 230. In one or more embodiments, the capacitor arrangement 230 may be electrically coupled to winding 222 using conductive vias.

Figure 5:
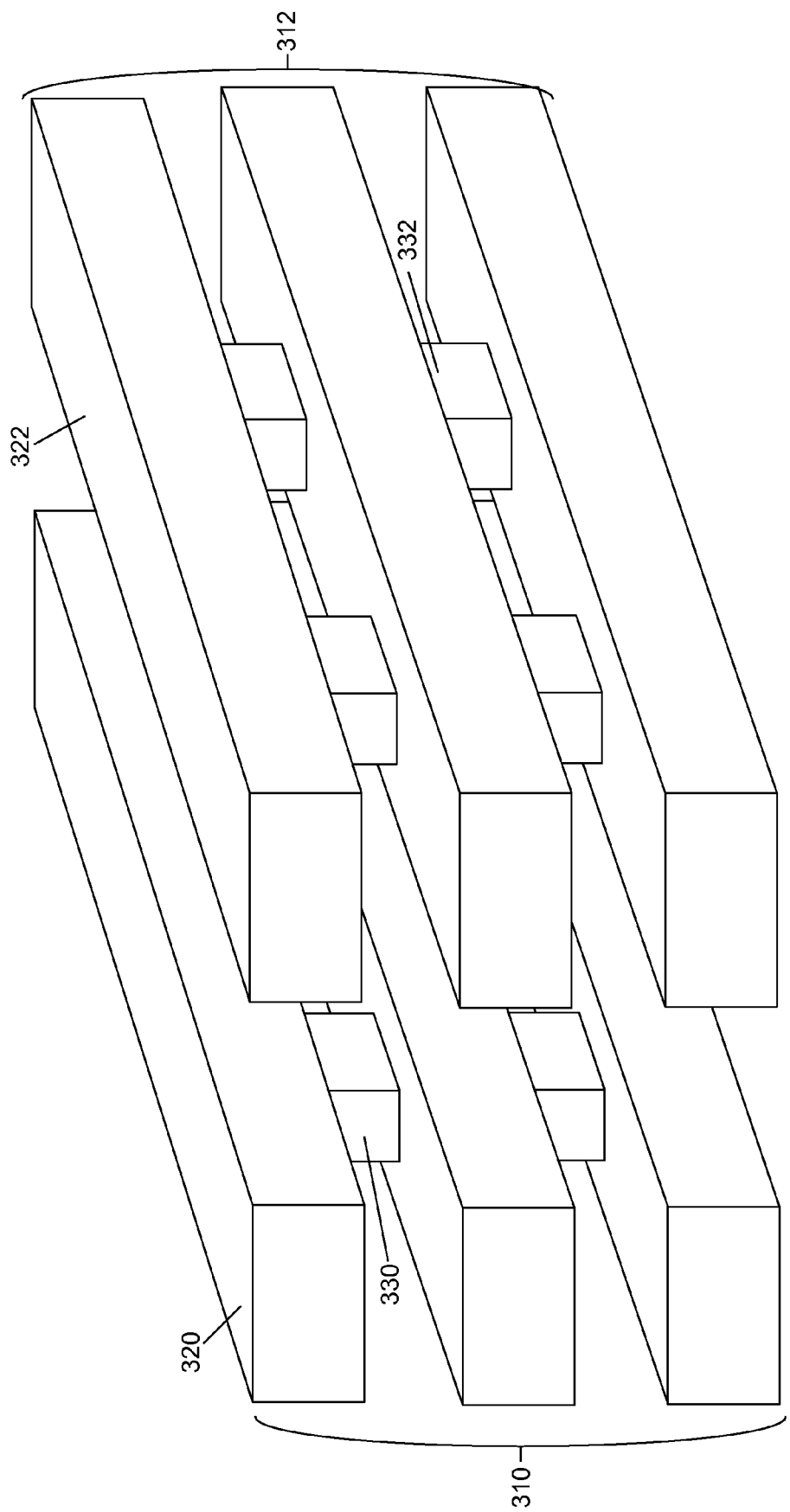
FIG. 5 shows a detailed view of vertical plates of the capacitor arrangement in accordance with an embodiment of the present invention.

FIG. 5 shows a three dimensional view of an embodiment of a first conductive plate 310 and an embodiment of a second conductive plate 312 that are spacedly disposed from each other in a side by side arrangement. In the embodiment shown in FIG. 5, the conductive plate 310 faces the conductive plate 312. In the embodiment shown, the first conductive plate 310 includes conductive lines 320. Likewise, the second conductive plate 312 includes conductive lines 322. Generally, each first plate 310 may include one or more conductive lines 320. In an embodiment, each first plate 310 may include a plurality of conductive lines 320. Generally, each second plate 312 may include one or more conductive lines 322. In an embodiment, each second plate 312 may include a plurality of conductive lines 322.

In the embodiment shown in FIG. 5, the conductive lines 320 may be disposed so that one is at least partially over the other. In one or more embodiments, the conductive lines 320 may be substantially parallel to each other. Likewise, the conductive lines 322 may be disposed so that one is at least partially over the other. In one or more embodiments, the conductive lines 322 may be substantially parallel to each other. Other configurations are also possible.

In one or more embodiments, the conductive lines (and, hence, the plates) may be made to taper from wide to narrow. As an example, they may be made so as to become narrower as they move away from the connection bar.

The conductive lines 320 may be electrically coupled together. Electrical coupling may be accomplished using one or more conductive vias 330. Likewise, the conductive lines 322 may be electrically coupled together. Electrical coupling may be accomplished using one or more conductive vias 332.

Generally, one or more conductive vias may be used to couple one conductive line to an adjacent conductive line of the same plate. In one or more embodiments, a plurality of conductive vias may be used to electrically couple one conductive line to an adjacent conductive line of the same plate. In the embodiment shown, the conductive vias 330,332 have a square cross section but, in other embodiments, the conductive vias may have any cross sectional shape such as square, round, ellipse, rectangle.

In the embodiment shown in FIG. 4A, the conductive vias 330 are staggered relative to the conductive vias 332. However, in one or more embodiments, the conductive vias 330 may be aligned relative to the conductive vias 332.

Generally, the conductive lines 320, 322 as well as the conductive bars 340, 342 as well as the conductive vias 330, 332 may comprise any conductive material. In one or more embodiments, the conductive lines and/or conductive bars and/or the conductive vias may comprise a metallic material. For example, the metallic material may comprise a pure metal or a metal alloy. In one or more embodiments, the metallic material may comprise one or more elements selected from the group consisting of Al (aluminum), Cu (copper), Au (gold), Ag (silver), W (tungsten), Ti (titanium), and Ta (tantalum). Examples of possible metallic materials include, but not limited to, pure aluminum, aluminum alloy, pure copper, copper alloy, pure gold, gold alloy, pure silver, silver alloy, pure tungsten, tungsten alloy, pure titanium, titanium alloy, pure tantalum and tantalum alloy.

In one or more embodiments, the conductive lines, conductive bars as well as the conductive vias of one or both of the capacitor electrodes may comprise at least a portion of the metallization system of a semiconductor device. The metallization system may comprise conductive (or metal) lines from one or more metallization layers of various metallization levels (for example, Metal 1, Metal 2, Metal 3, etc.) of a semiconductor device. The metallization system may further comprise conductive vias which connect conductive (or metal) lines of one metallization level to conductive (or metal) lines of another metallization level.

In one or more embodiments, the conductive lines and/or the conductive bars and/or the conductive vias may be formed of non-metallic conductive materials. For example, such conductive materials may include silicon material. The silicon material may, for example, be a polysilicon. The polysilicon may, for example, be p-doped or n-doped.

In one or more embodiments, the conductive vias may be conductive interconnects formed between a metallization layer of a first metallization level to a metallization layer of a second metallization level (for example, between Metal 1 and Metal 2, etc.) of a semiconductor device. It is noted that, more generally, the conductive vias may be any other type of conductive interconnect (such as, for example, the conductive interconnect between the substrate and Metal 1).

The capacitance of the capacitor arrangement 230 may be changed by switching the transistors T1, T2 and/or T3 either on or off. The transistors may, of course, be replaced by any other type of controllable switching device or controllable interconnect device. Hence, the total capacitance of the capacitor arrangement may be modified or adjusted. Other ways to modify or adjust the capacitance may also be used.

In one or more embodiments of the invention, the capacitor arrangement 230 may include at least one vertical parallel plate capacitor having substantially vertical plates. It is noted that the substantially vertical orientation of the plates may help to substantially prevent eddy currents from forming in the plates of the capacitor arrangement 230.

It is also noted that in the embodiment shown in FIG. 4A, the conductive lines 320, 322 of the capacitor assembly may be oriented such that the lengths of the conductive lines 320, 322 may be oriented in substantially the same direction as the end portions 224A and 224B of the winding 222. In one or more embodiments, this may help to maximize the total inductance of the LC semiconductor device 210.

Figure 4B:
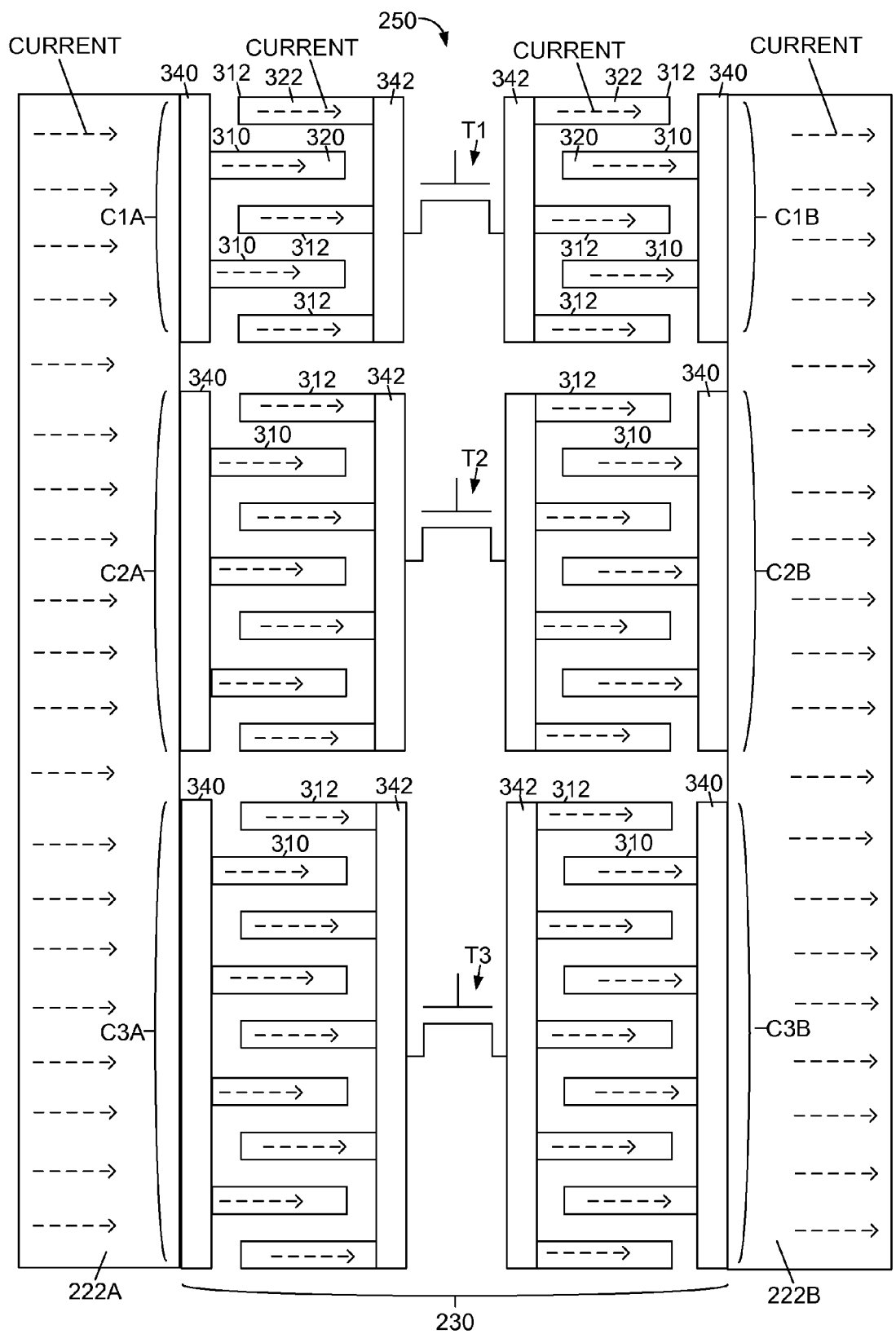
FIG. 4B shows current lines in end portions of the winding of the inductor coil and in the capacitor arrangement in accordance with an embodiment of the invention.

In one or more embodiments, the current density in the conductive lines 320, 322 (during charging of the capacitor arrangement 230) may be in substantially the same direction as the current density in the end portions 224A and 224B of the winding 222 of the inductor coil 220. An example is shown in FIG. 4B, which shows that the current density CURRENT in each of the end portions 224A, 224B is orientated in substantially the same direction as the current density CURRENT in the conductive lines 320, 322 of capacitor arrangement 230. In one or more embodiments, the current density CURRENT in each of the end portions 224A, 224B may be substantially parallel with the current density CURRENT in the conductive lines 320, 322 of capacitor arrangement 230. Current density may be a vector having a direction and a magnitude.

Figure 3B:
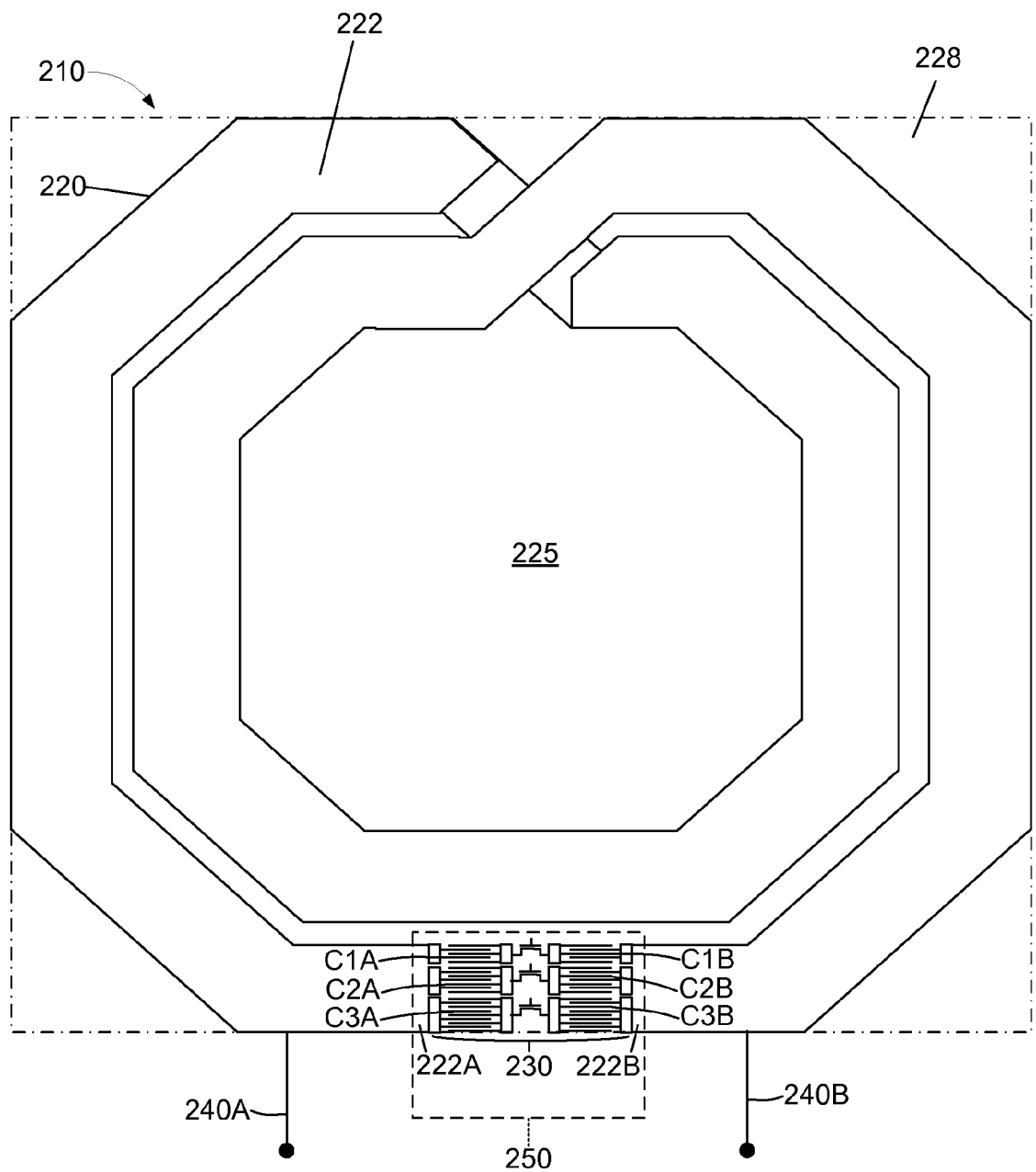
FIG. 3B shows an inductor coil and a capacitor arrangement is accordance with an embodiment of the invention.

FIG. 3B shows the LC semiconductor device 210 from FIG. 3A. FIG. 3B also shows a top view of the smallest cuboid 228 within which the inductor coil 220 can fit. The cuboid 228 is a three-dimensional box having six rectangular sides. The top view of the cuboid 228 shows a lateral cross section of the cuboid which is in the form of a rectangle (which, in some embodiments, may be a square). The footprint of the inductor coil 220 is the footprint (e.g. projection onto the substrate) of the cuboid 228.

In one or more embodiments, the footprint of the inductor coil 220 may at least partially overlap the footprint (e.g. projection onto the substrate) of the capacitor arrangement 230. In one or more embodiments, the footprint of the capacitor arrangement 230 may at least partially overlap the footprint of the winding 222 of the inductor coil 220. In one or more embodiments, the footprint of the capacitor arrangement 230 may at least partially overlap the footprint of the interior region 225 of the inductor coil 220.

In one or more embodiments, the capacitor structure 230 may at least partially overlie or at least partially underlie the inductor coil 220. In one or more embodiments, the capacitor arrangement 230 may at least partially overlie or at least partially underlie the winding 222. In one or more embodiments, the capacitor arrangement 230 may be placed within the interior region 225 of the inductor coil 220. In one or more embodiments, the capacitor arrangement 230 may at least partially overlie or at least partially underlie the interior region 225 of the inductor coil 220.

Figure 2B:
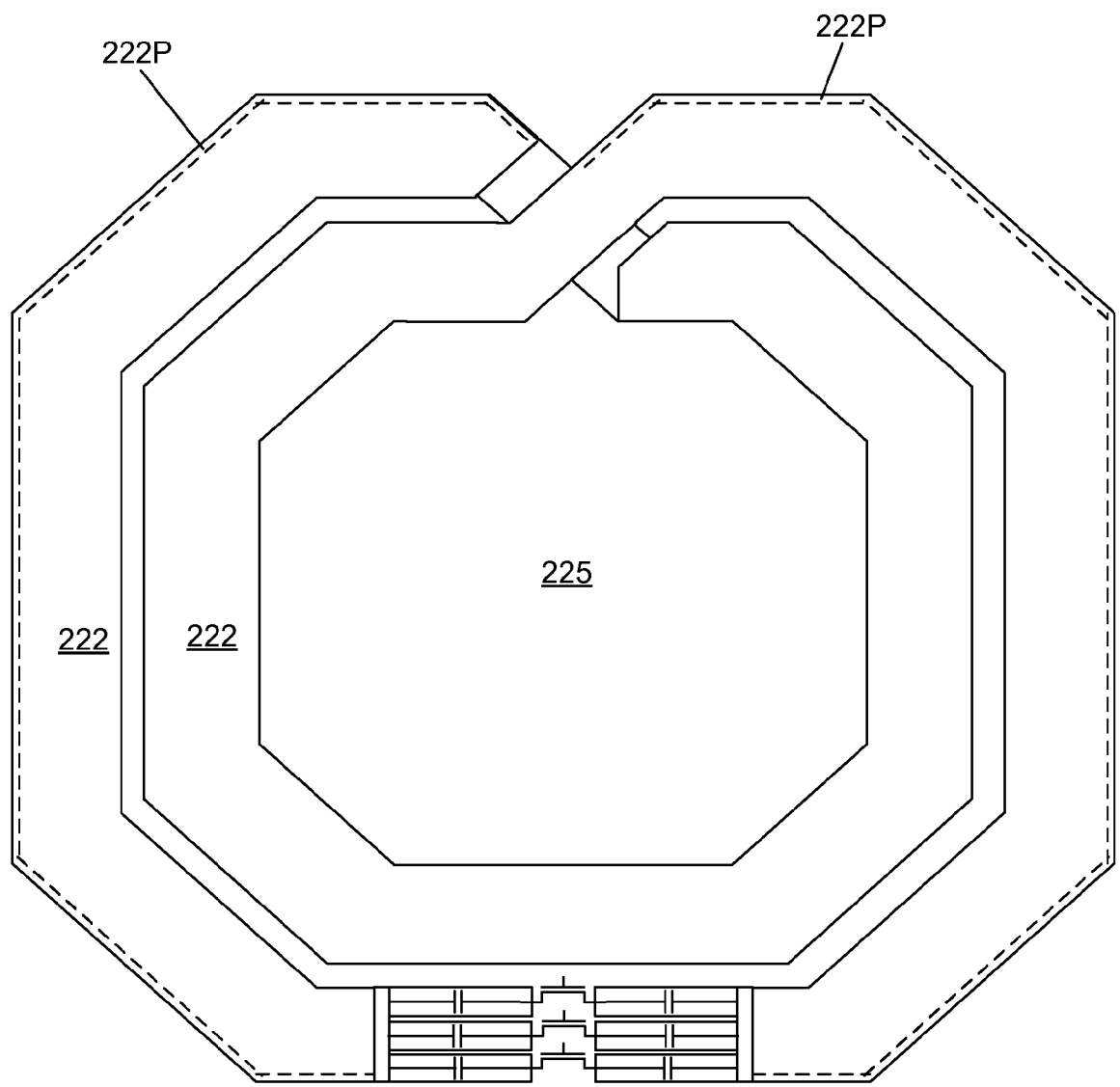
FIG. 2B shows an inductor coil and a capacitor arrangement in accordance with an embodiment of the present invention.

In one or more embodiments, the capacitor arrangement 230 may be brought relatively close to the inductor coil 220. In one or more embodiments, the capacitor arrangement 230 may be brought sufficiently close so that the magnetic field at the capacitor arrangement is sufficiently strong. In an embodiment, the maximum magnetic field at the capacitor arrangement may be at least 50% of the maximum magnetic field at the outer perimeter of the winding 222 of the inductor coil 220. In an embodiment, the maximum magnetic field at the capacitor arrangement may be at least 70% of the maximum magnetic field at the outer perimeter of the winding 222 of the inductor coil 220. In an embodiment, the maximum magnetic field at capacitor arrangement may be at least 80% of the maximum magnetic field at the outer perimeter of the winding 222 of the inductor coil 220. In an embodiment, the maximum magnetic field at the capacitor arrangement may be at least 90% of the maximum magnetic field at the outer perimeter of the winding 222 of the inductor coil 220. FIG. 2B shows an example of the outer perimeter 222P of the winding 222 of the inductor coil.

Referring to FIG. 3A, in one or more embodiments, the capacitor arrangement 230 may at least partially overlie or at least partially underlie the conductive coil 220. For example, in one or more embodiments, the capacitor arrangement 230 may at least partially overlie or at least partially underlie the winding 222. It is possible that this may help reduce the combined parasitic capacitance of the inductor coil 220 and the capacitor arrangement 230. By arranging the inductor coil 220 and the capacitor arrangement 230 in this way at least a portion of the parasitic capacitance between the inductor coil and the substrate may be shared with at least a portion of the parasitic capacitance between the capacitor arrangement and the substrate.

Referring to the embodiment shown in FIG. 3A, the capacitor arrangement 230 may provide a capacitive component represented by $C_{230}$. In one or more embodiments, the capacitor arrangement 230 may also provide an inductive component represented by $L_{230}$. In one or more embodiments, when a current charges the capacitor arrangement 230, an inductance $L_{230}$ may be created which may contribute to total inductance of the LC semiconductor device 210.

The contribution of the capacitor arrangement 230 to the total inductance of the LC semiconductor device 210 may be written as $L_{230}$. Hence, in one or more embodiments, the capacitor arrangement 230 may provide both a capacitive component $C_{230}$ as well as inductive component $L_{230}$. These two components may be from the same physical structure (the capacitor arrangement 230) which may, for example, be disposed over a substrate. The inductive component and the capacitive component of the capacitor arrangement 230 may share the same physical space over the substrate and may also share the same footprint (e.g. the projection onto the substrate). Hence, in one or more embodiments, the parasitic capacitance between the capacitive component $C_{230}$ (of the capacitor arrangement 230) and substrate may be the same as the parasitic capacitance of the inductive component $L_{230}$ (of the same capacitor arrangement 230) and the substrate.

Also disclosed herein are semiconductor chips, integrated circuits and other semiconductor devices that comprise the LC semiconductor device described herein. In one or more embodiments, the LC semiconductor device may be incorporated into a semiconductor chip, an integrated circuit and/or a semiconductor device. In one or more embodiments, the LC semiconductor device may be part of a circuit (for example, an integrated circuit) such as a radio frequency (RF) circuit.

Figure 6A:
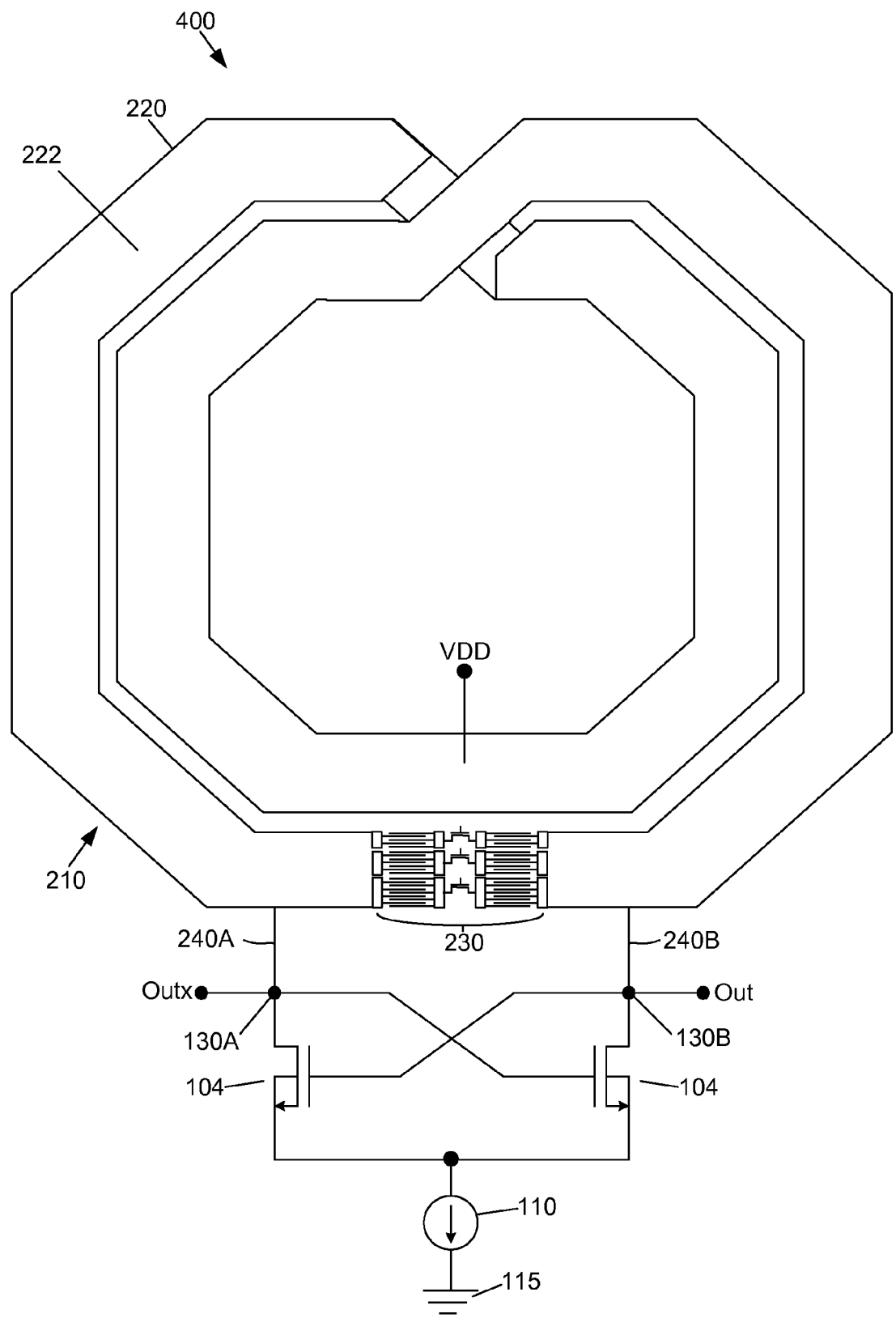
FIG. 6A shows an example of a circuit that includes an embodiment of an LC semiconductor device in accordance with the present invention.

FIG. 6A shows an embodiment of a circuit (for example, an integrated circuit) that includes an LC semiconductor device. FIG. 6A shows a circuit 400 which includes the LC semiconductor device 210. The LC semiconductor device 210 is electrically coupled to the nodes 130A and 130B. In one or more embodiments, the node 130A and the node 130B may be electrically coupled to the winding 222 of the conductive coil 210 on opposite sides of the capacitor arrangement 230. Terminals 240A and 240B are used to electrically couple the LC semiconductor device 210 to the nodes 130A, 130B.

In one or more embodiments, the capacitor arrangement 230 may be electrically coupled to the inductor coil 220 so that the capacitor arrangement 230 is in series with the inductor coil 220. In the embodiment shown in FIG. 6A, the current source/sink 110 is coupled to ground 115. In the embodiment shown, the winding 222 of the inductor coil 220 is coupled to voltage supply VDD. The embodiment shown in FIG. 6A includes transistors 104. Other configurations are also possible.

Figure 6B:
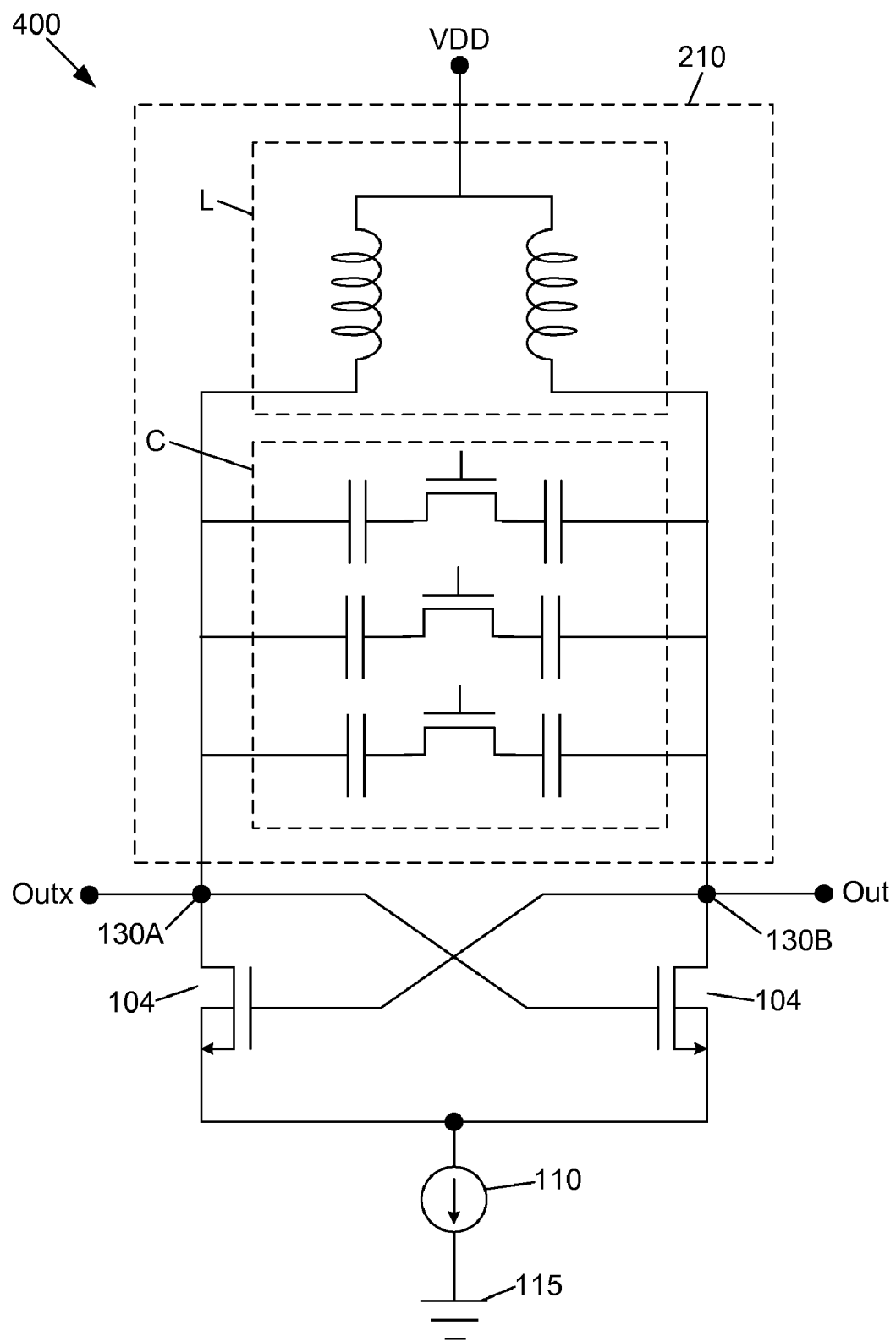
FIG. 6B shows a schematic diagram of the circuit of FIG. 6A.

A schematic equivalent of circuit 400 is shown in FIG. 6B. The LC semiconductor device 210 provides an inductive component L and a capacitive component C.

In one or more embodiments, it is possible that the entire circuit 400 be formed on a single semiconductor chip (and may be within and/or over a single semiconductor substrate). In one or more embodiments, it is possible that the circuit 400 be formed as part of two or more semiconductor chips that are electrically coupled together. For example, the LC semiconductor device 210 may be formed on a first chip and the remaining portion of the circuit 400 be formed on a second chip.

Referring to FIG. 6B, the LC semiconductor device 210 includes an inductive component L and a capacitive component C. The LC semiconductor device 210 may also include a resistive component R. The resonant quality factor $Q_o$ may be defined as $Q_o=(1/R)\sqrt{(L/C)}$, which represents:

(1/R) multiplied by the square root of (L/C).

In one or more embodiments, the LC semiconductor device 210 may be designed to have a resonant quality factor $Q_o$ greater than 1. In one or more embodiments, the LC semiconductor device 210 may be designed to have a resonant quality factor $Q_o$ greater than 5.

Disclosed herein is a semiconductor device which, in one or more embodiments, may have a resonant quality factor $Q_o$ greater than 1. In one or more embodiments, the inductor coil may have a resonant quality factor $Q_o$ greater than 5.

While the present invention has been described with respect to a limited number of embodiments, those skilled in the art will appreciate numerous modifications and variations thereof. It is intended that the appended claims cover all such modifications and variations as fall within the true spirit and scope of this present invention.

What is claimed is:

1. A semiconductor device, comprising:
   an inductor coil including a winding; and
   a capacitor arrangement including at least one vertical parallel plate capacitor, said capacitor arrangement electrically coupled to said inductor coil, the footprint of the capacitor arrangement at least partially overlapping the footprint of said inductor coil.

2. The device of claim 1, wherein the footprint of said capacitor arrangement at least partially overlaps the footprint of said winding.

3. The device of claim 1, wherein said inductor coil includes an interior region, said capacitor arrangement at least partially overlying, at least partially underlying or at least partially within said interior region.

4. The device of claim 1, wherein there are substantially no eddy currents in said capacitor arrangement during charging of said capacitor arrangement.

5. The device of claim 1, wherein said capacitor arrangement is coupled between a first end portion of said winding and a second end portion of said winding.

6. The device of claim 5, wherein the current density in the capacitor arrangement is in substantially the same direction as the current density in said first and second end portions during charging of said capacitor arrangement.

7. A semiconductor device, comprising:
   an inductor coil including a winding; and
   a capacitor arrangement including at least one vertical parallel plate capacitor, said capacitor arrangement electrically coupled to said inductor coil, said capacitor arrangement at least partially overlying or at least partially underlying said inductor coil.

8. The device of claim 7, wherein said capacitor arrangement at least partially overlies or at least underlies said winding.

9. The device of claim 7, wherein said capacitor arrangement at least partially underlies said winding.

10. The device of claim 7, wherein said semiconductor device has a resonant quality factor $Q_o$ greater than 1.

11. The device of claim 7, wherein said capacitor arrangement comprising at least a portion of a metallization system of said semiconductor device.

12. A semiconductor device, comprising:
    an inductor coil including a winding; and
    a capacitor arrangement including at least one vertical parallel plate capacitor, said capacitor arrangement electrically coupled to said inductor coil, wherein the maximum magnetic field at the capacitor arrangement is at least 70% of the maximum magnetic field at the outer perimeter of said winding.

13. The device of claim 12, wherein the maximum magnetic field experienced by said capacitor arrangement is at least 80% of the maximum magnetic field at the outer perimeter of said winding.

14. The device of claim 12, wherein the maximum magnetic field at said capacitor arrangement is at least 90% of the maximum magnetic field at the outer perimeter of said winding.

15. The device of claim 12, wherein said capacitor is a vertical parallel plate capacitor.

16. A semiconductor device, comprising:
    a substrate;
    an inductor coil disposed over said substrate; and
    a capacitor arrangement including at least one vertical parallel plate capacitor, said capacitor arrangement electrically coupled to said inductor coil, said capacitor arrangement disposed over said substrate, wherein at least a portion of the parasitic capacitance between said inductor coil and said substrate is shared with at least a portion of the parasitic capacitance between said capacitor arrangement and said substrate.

17. A semiconductor device, comprising:

an inductor coil including a winding; and a capacitor arrangement including at least one capacitor, said capacitor arrangement electrically coupled between a first end portion of said winding and a second end portion of said winding, the footprint of the capacitor arrangement at least partially overlapping the footprint of said inductor coil.

18. The device of claim 17, wherein the current density in the capacitor arrangement is in substantially the same direction as the current density in said first and second end portions during charging of said capacitor arrangement.

19. The device of claim 17, wherein the footprint of said capacitor arrangement at least partially overlaps the footprint of said winding.

* * * * *